United States Patent
Huang et al.

(10) Patent No.: US 9,377,693 B2
(45) Date of Patent: Jun. 28, 2016

(54) COLLECTOR IN AN EXTREME ULTRAVIOLET LITHOGRAPHY SYSTEM WITH OPTIMAL AIR CURTAIN PROTECTION

(71) Applicant: Taiwan Semiconductor Manufacturing Company, Ltd., Hsin-Chu (TW)

(72) Inventors: Chia-Ching Huang, Yilan County (TW); Tsung-Yu Chen, Hsinchu (TW); Chia-Hao Hsu, Hsinchu (TW); Shinn-Sheng Yu, Hsinchu (TW); Chia-Chen Chen, Hsinchu (TW)

(73) Assignee: Taiwan Semiconductor Manufacturing Company, Ltd., Hsing-Chu (TW)

(*) Notice: Subject to any disclaimer, the term of this patent is extended or adjusted under 35 U.S.C. 154(b) by 174 days.

(21) Appl. No.: 14/208,156

(22) Filed: Mar. 13, 2014

(65) Prior Publication Data

US 2015/0261094 A1    Sep. 17, 2015

(51) Int. Cl.
*G03B 27/54* (2006.01)
*G03F 7/20* (2006.01)
*H05G 2/00* (2006.01)

(52) U.S. Cl.
CPC .......... *G03F 7/70033* (2013.01); *H05G 2/005* (2013.01); *H05G 2/008* (2013.01)

(58) Field of Classification Search
CPC .......... G03F 7/70033; G03F 7/70925; G03F 7/70916; G03F 7/70166; H05G 2/008

USPC .......................................................... 355/67
See application file for complete search history.

(56) References Cited

U.S. PATENT DOCUMENTS

| | | | |
|---|---|---|---|
| 2007/0131878 A1* | 6/2007 | Banine | B82Y 10/00 250/492.2 |
| 2011/0188014 A1* | 8/2011 | Banine | G03F 7/70033 355/30 |
| 2013/0161540 A1* | 6/2013 | Nagai | H05G 2/005 250/504 R |

OTHER PUBLICATIONS

"Laser Produced Plasma Technology," Cymer an ASML Company printed from www.cymer.com/pp_technology/[Jan. 30, 2014 10:50:35 AM], 2 pages.

Torsten Feigl et al., "High-Temperature LPP Collector Mirror," Proc. of SPIE vol. 6151, 61514A, (2006), 9 pages, Emerging Lithographic Technologies X.

* cited by examiner

*Primary Examiner* — Peter B Kim
(74) *Attorney, Agent, or Firm* — Haynes and Boone, LLP

(57) ABSTRACT

The present disclosure provides an extreme ultraviolet (EUV) radiation source module. The EUV radiation source module includes a collector designed to collect and reflect EUV light; a solid cover integrated with the collector and configured to have a supply gap between the collector and the solid cover; and a gas pipeline integrated with the collector. The supply gap provides a path for gas flow to the radiation source at edge of the collector. The gas pipeline includes an inward entrance and an outward entrance.

20 Claims, 7 Drawing Sheets

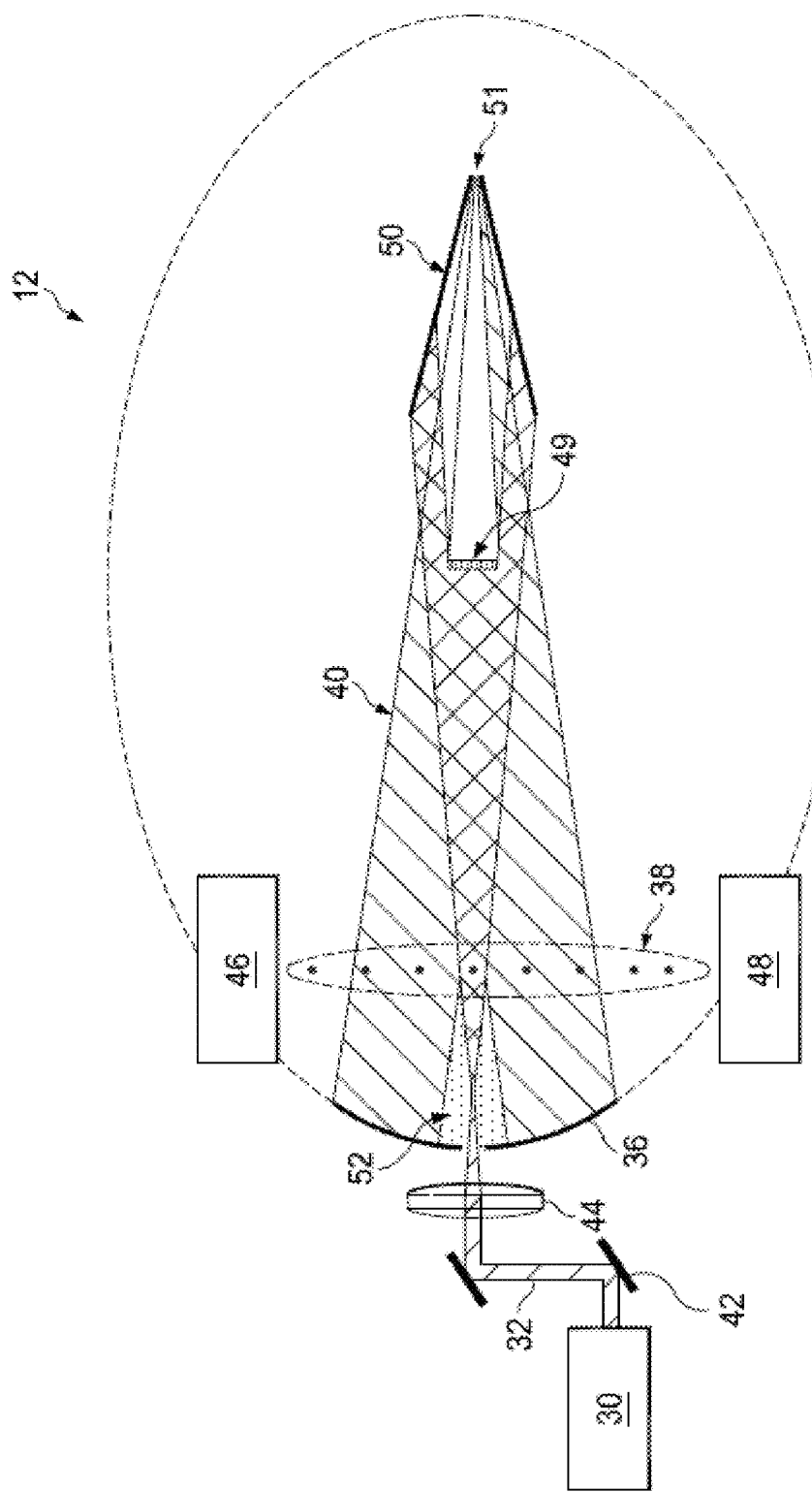

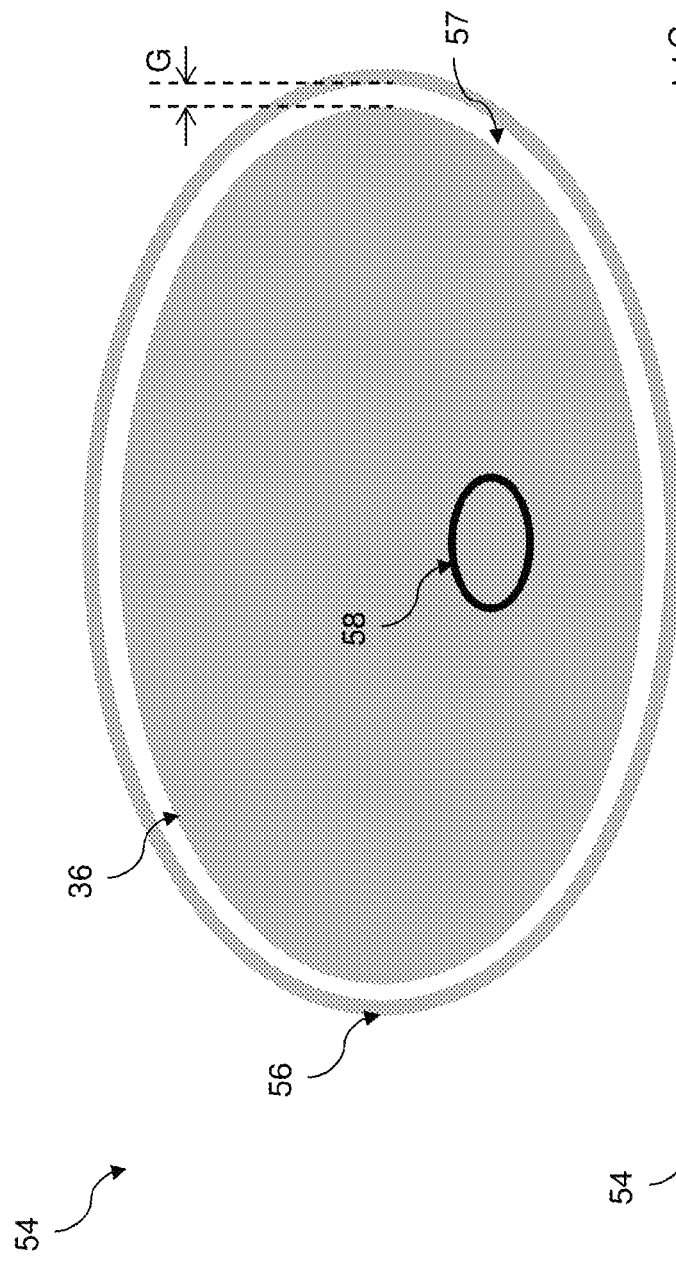
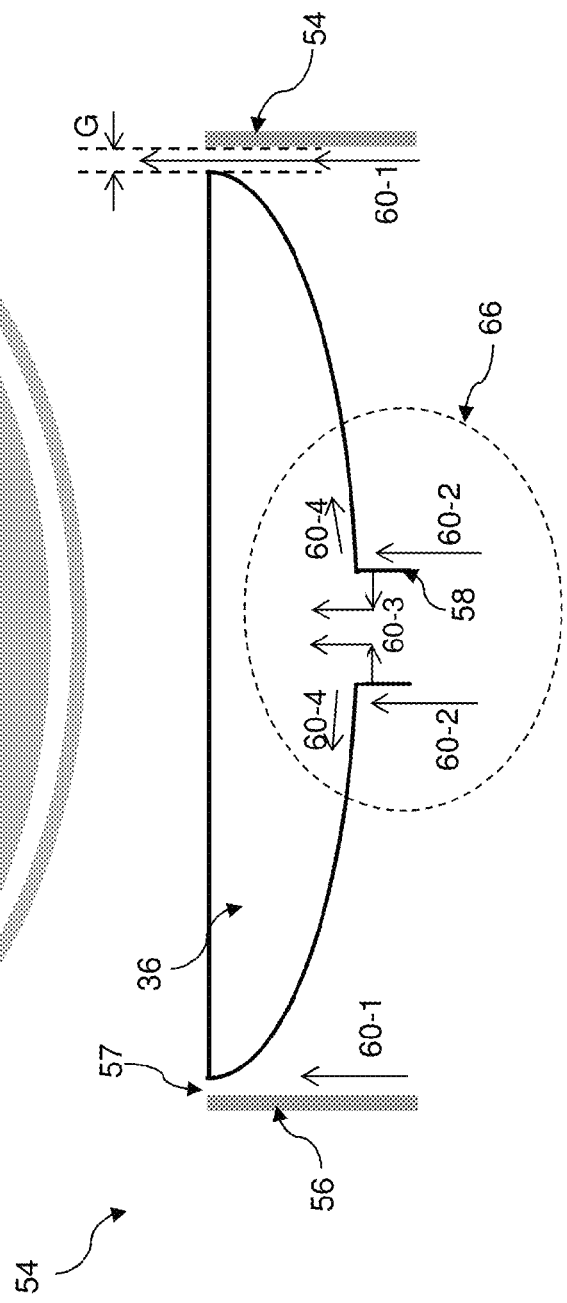

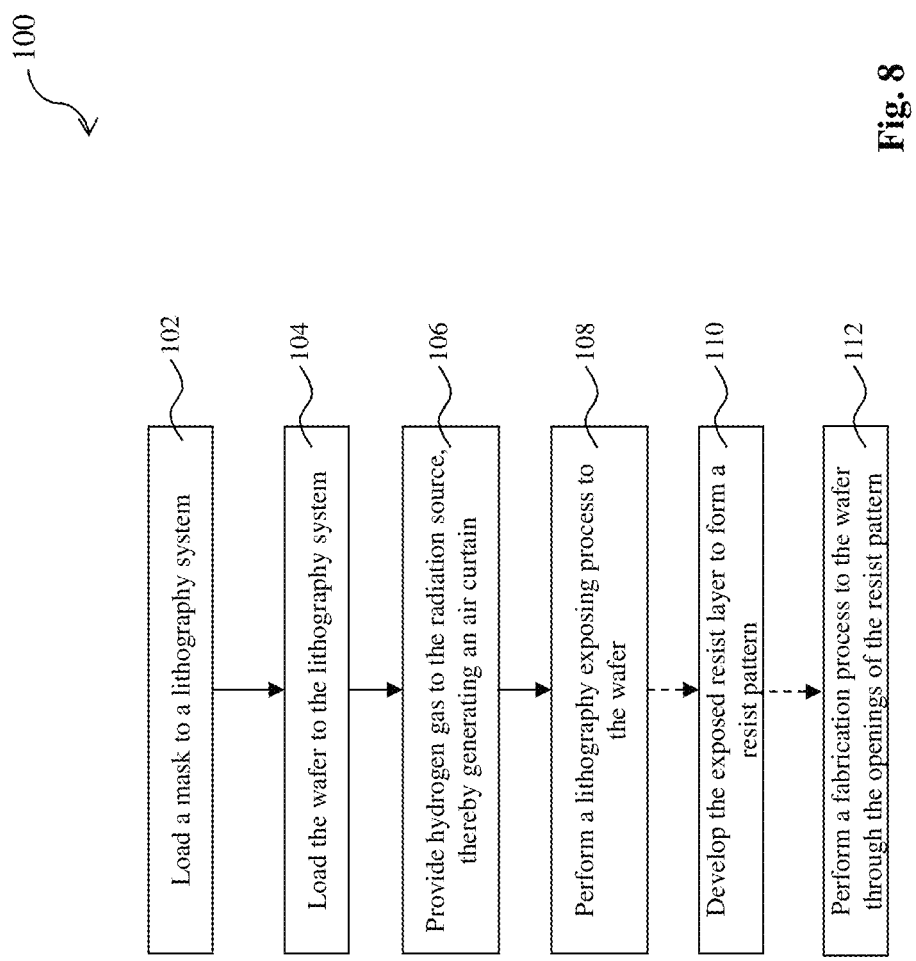

COLLECTOR IN AN EXTREME ULTRAVIOLET LITHOGRAPHY SYSTEM WITH OPTIMAL AIR CURTAIN PROTECTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except for that the EUV scanners use reflective rather than refractive optics, i.e., mirrors instead of lenses.

Therefore, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a diagrammatic view of the EUV radiation source in the EUV lithography system of FIG. 1, constructed in accordance with some embodiments.

FIG. 4 is diagrammatic perspective view of a collector module in the EUV radiation source of FIG. 2 or 3, constructed in accordance with some embodiments.

FIG. 5 is diagrammatic sectional view of the collector module of FIG. 4 constructed in accordance with some embodiments.

FIG. 8 is a flowchart of a lithography process constructed in accordance with some embodiments.

DETAILED DESCRIPTION

Figure 1:
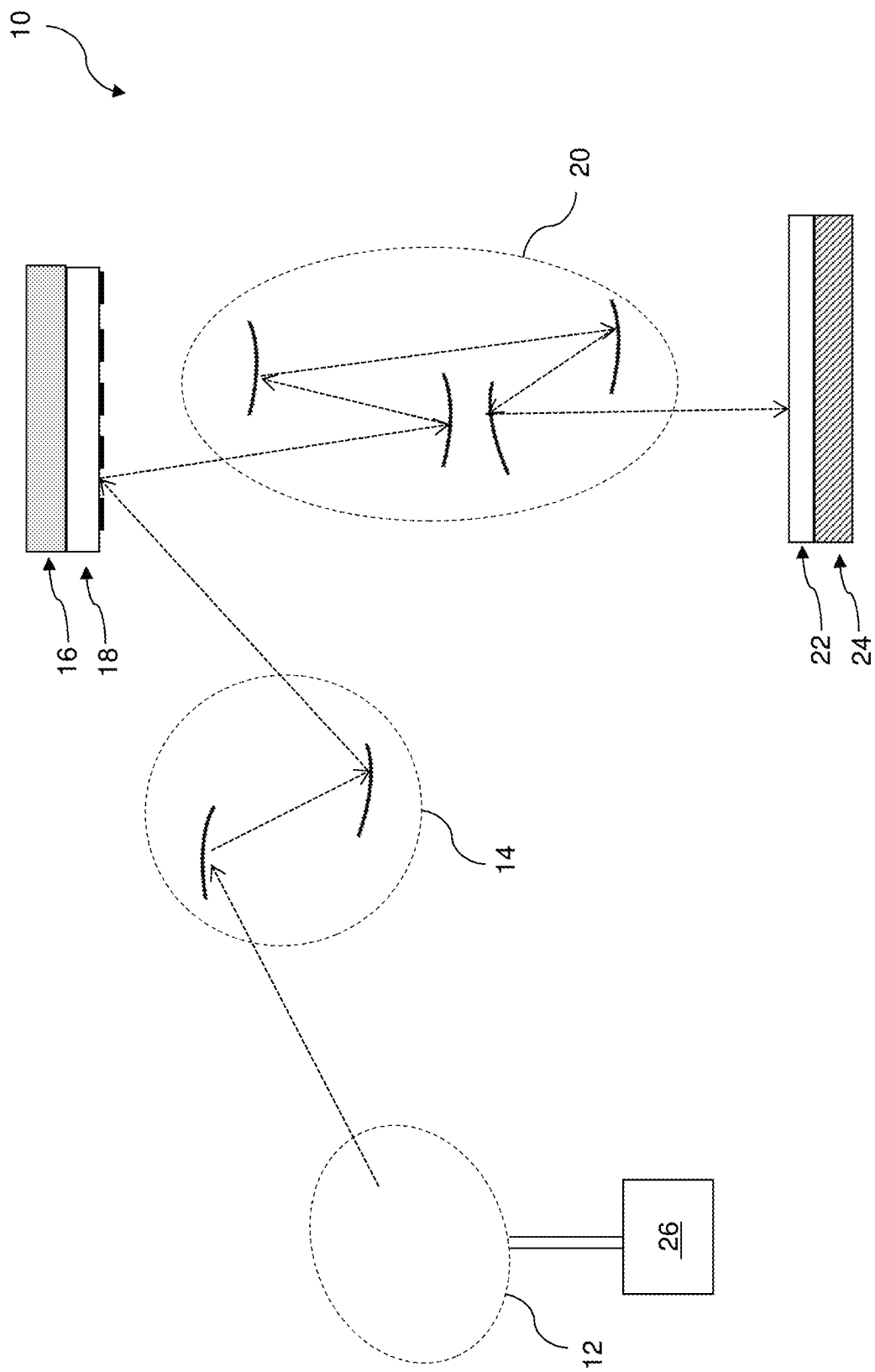
FIG. 1 is a schematic view of an EUV lithography system with a laser produced plasma (LPP) EUV radiation source, constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view diagram of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12. In the present embodiment, the EUV radiation source 12 utilizes a mechanism of laser-produced plasma (LPP) to generate the EUV radiation, which will be further described later.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, reflective optics is employed.

The lithography system 10 also includes the mask stage 16 configured to secure a mask 18. In some embodiments, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss. In the disclosure, the terms of mask, photomask, and reticle are used to refer to the same item. In the present embodiment, the lithography system 10 is an EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB) 20 for imaging the pattern of the mask 18 on to a semiconductor substrate 22 secured on a substrate stage 24 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20. The illuminator 14 and the POB 20 are collectively referred to an optical module of the lithography system 10.

The lithography system 10 also includes the substrate stage 24 to secure a semiconductor substrate 22. In the present embodiment, the semiconductor substrate 22 is a semiconductor wafer, such as a silicon wafer or other type of wafer to be patterned. The semiconductor substrate 22 is coated with the resist layer sensitive to the radiation beam, such as EUV light in the present embodiment. Various components including those described above are integrated together and are operable to perform lithography exposing processes.

The lithography system 10 may further include other modules or be integrated with (or be coupled with) other modules. In some embodiments, the lithography system 10 includes a gas supply module 26 designed to provide hydrogen gas to the radiation source 12.

Figure 2:
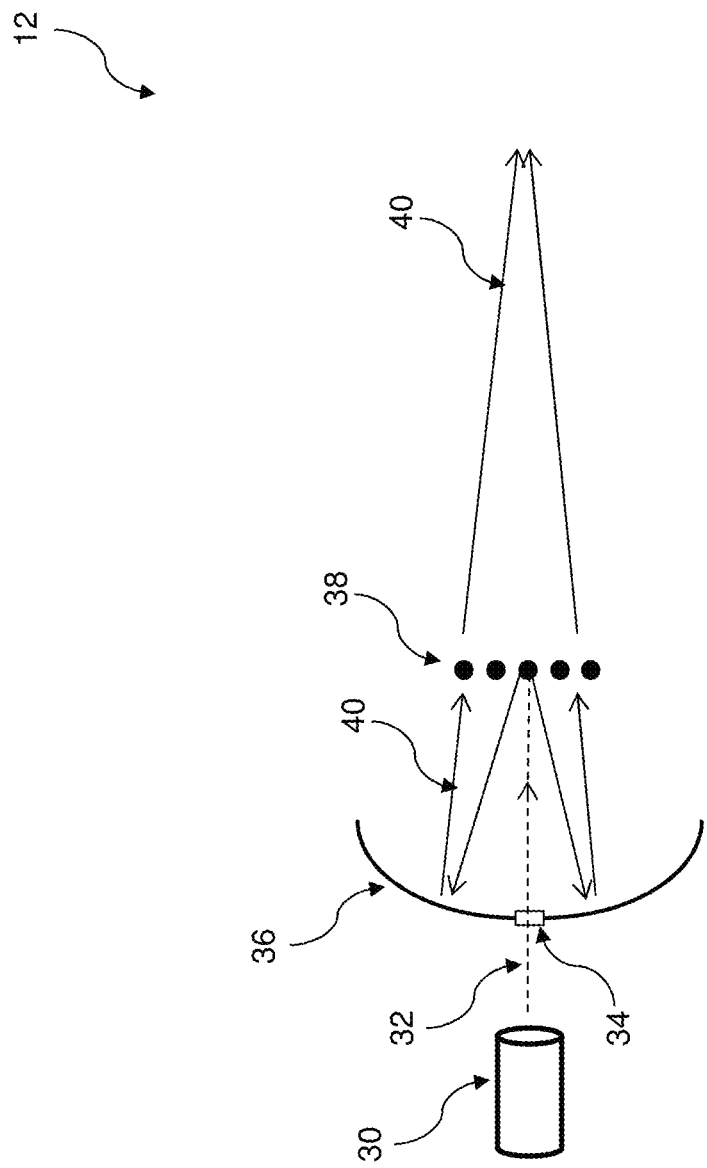
FIG. 2 is a diagrammatic view of the EUV radiation source in the EUV lithography system of FIG. 1, constructed in accordance with some embodiments.

Particularly, the radiation source 12 is further illustrated in FIG. 2 in a diagrammatical view, constructed in accordance with some embodiments. The radiation source 12 employs a laser produced plasma (LPP) mechanism to generate plasma and further generate EUV light from the plasma. The radiation source 12 includes a laser 30, such as pulse carbon dioxide ($CO_2$) laser to generate laser beam 32. The laser beam is directed through an output window 34 integrated with a collector (also referred to as LPP collector or EUV collector) 36. The output window 34 adopts a suitable material substantially transparent to the laser beam. The collector 36 is designed with proper coating material and shape, functioning as a mirror for EUV collection, reflection and focus. In some embodiments, the collector 36 is designed to have an ellipsoidal geometry. In some embodiments, the coating material of the collector 36 is similar to the reflective multilayer of the EUV mask 18. In some examples, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the laser beam directed onto the collector 36. For example, a silicon nitride layer is coated on the collector 36 and is patterned to have a grating pattern.

The laser beam 32 is directed to heat a target material 38, such as Tin droplets, thereby generating high-temperature plasma, which further produces EUV radiation (or EUV light) 40. The EUV radiation 40 is collected by the collector 36. The collector 36 further reflects and focuses the EUV radiation for the lithography exposing processes.

The radiation source 12 is configured in an enclosed space (referred to as a source vessel). The source vessel is maintained in a vacuum environment since the air absorbs the EUV radiation.

The radiation source 12 may further be integrated with or coupled with other units/modules. For example, the gas supply module 26 is coupled with the radiation source 12, thereby providing hydrogen gas for various protection functions, which include effectively protecting the collector 36 from the contaminations by Tin particles (Tin debris). This is achieved by the disclosed design of the radiation source 12 with the method to utilize the same. The radiation source 12 may further include more components integrated together, such as those illustrated in FIG. 3.

FIG. 3 is in a diagrammatical view of the radiation source 12, constructed in accordance with some embodiments. The radiation source 12 employs a LPP mechanism. The radiation source 20 includes a laser 30, such as pulse $CO_2$ laser to generate laser beam 32. The laser beam 32 is directed by a beam delivery system 42, such as one or more mirrors configured, to a focus lens 44 to focus the laser beam 32. The laser beam 32 is further projected through the output window 34 integrated with a collector 36. The laser beam 32 is focused to the target material 38, such as Tin droplets, thereby generating high-temperature plasma. The Tin droplets are generated by a Tin droplet generator 46. A Tin catcher 48 is further configured to catch the Tin droplets. Thus generated high-temperature plasma further produces EUV radiation 40, which is collected by the collector 36. The collector 36 further reflects and focuses the EUV radiation for the lithography exposing processes. The pulses of the laser 30 and the droplet generating rate of the Tin droplet generator 46 are controlled to be synchronized such that the Tin droplets 38 receive peak powers consistently from the laser pulses of the laser 30.

The radiation source 12 further includes a central obscuration 49 designed and configured to obscure the laser beam 32. The radiation source 12 also includes an intermediate focus (IF)-cap module 50, such as an IF-cap quick-connect module configured to provide intermediate focus 51 to the EUV radiation 40. The IF-cap module 50 may additionally function to obscure the laser beam 32.

Especially, the radiation source 12 is enclosed in a vacuum environment since the air absorbs the EUV radiation. The gas supply module 26 is coupled with the radiation source 12 to provide hydrogen gas flow in a pattern to generate a hydrogen gas layer (also referred to as an air curtain) to effectively protect the coating surface (mirror surface) of the collector 36 from the contaminations by Tin particles. The hydrogen gas flow also generates a purge cone 52, as illustrated in FIG. 3. In the purge cone 52, the hydrogen flow protects the output window 34 from contamination and blows away the Tin particles coming to the collector 36.

Figure 6:
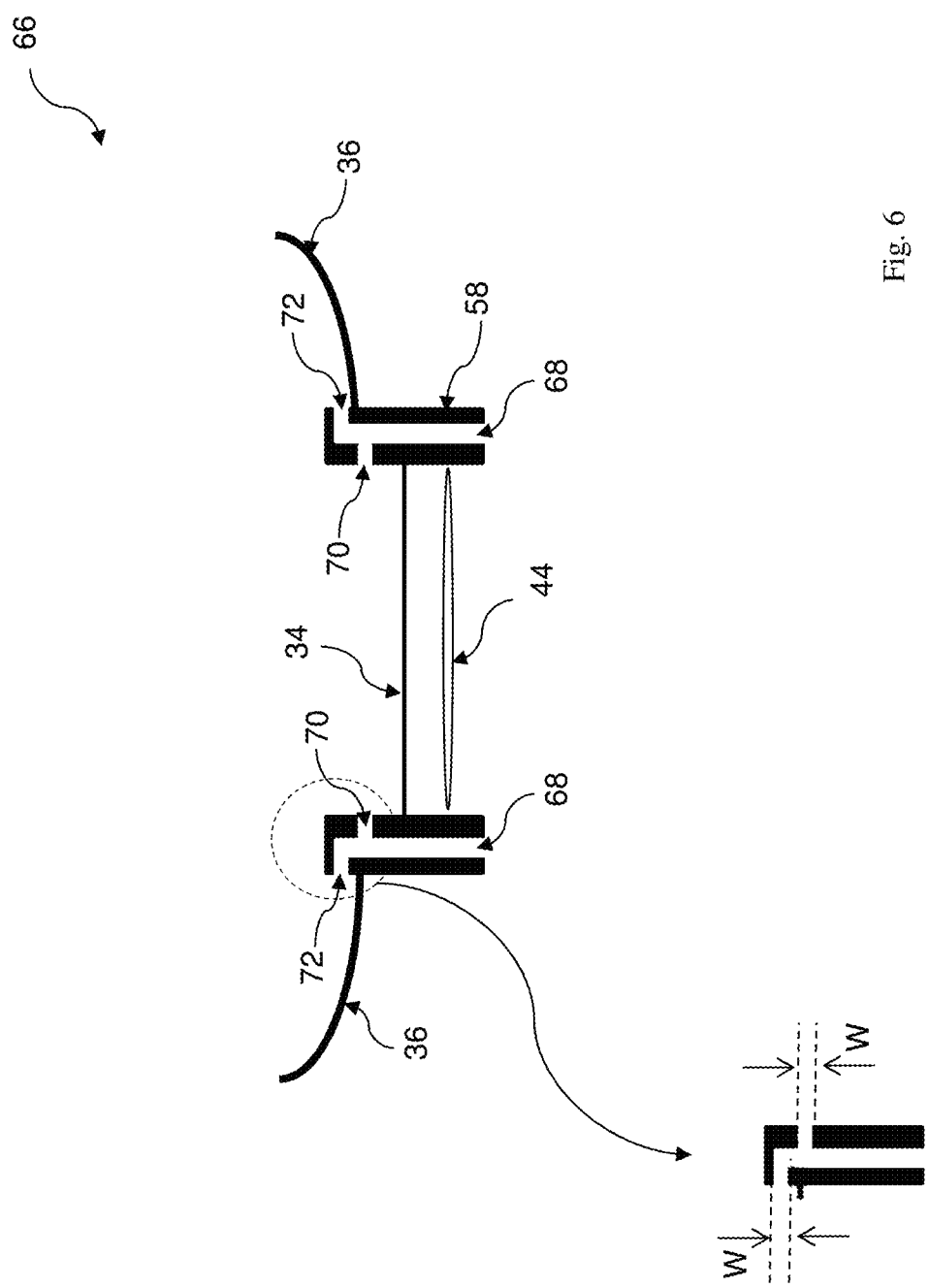
FIGS. 6 and 7 are diagrammatic sectional views of the collector module, in portion, constructed in accordance with some embodiments.
Figure 7:
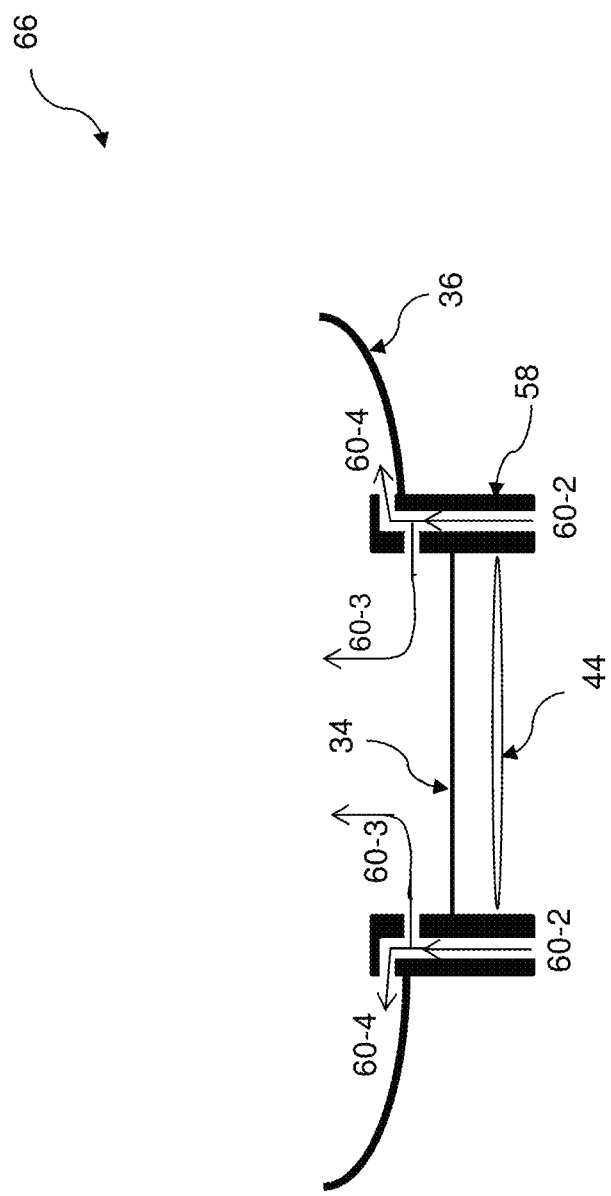

The collectors 36, the output window 34, a gas flow pipeline and other components are integrated into a collector module, which is further described below. FIG. 4 is a diagrammatical perspective view of a collector module 54 constructed in accordance with some embodiments. FIG. 5 is a diagrammatical sectional view of the collector module 54, constructed in accordance with some embodiments. FIGS. 6 and 7 are diagrammatical sectional views of the collector module 54, in portion, constructed in accordance with some embodiments. Each figure is drawn to illustrate some aspects of the collector module 54. The structure of the collector module 54 and the method implementing the same are collectively described with reference to FIGS. 4-7.

Referring to FIGS. 4 and 5, the collector module 54 includes the collector 36 with proper geometry and surface coating for collecting, reflecting and focusing the EUV radiation 40 generated from the hot plasma, where the hot plasma is produced by heating the Tin droplets with the laser beam 32. The collector module 54 also includes other components, structure and configuration to provide gas flows 60 (including 60-1, 60-2, 60-3 and 60-4) to the source vessel in a way to effectively protect the coating surface of the collector 36.

Particularly, the collector module 54 includes a solid cover 56 integrated with the collector 36. In some embodiments, the solid cover 56 is made of a suitable solid material, such as stainless steel. The solid cover 56 is designed and configured around the EUV collector 36 with a supply gap 57 defined therebetween, functioning as a gas flow path at the edge of the collector 36, thereby providing edge gas flow 60-1. The solid cover 56 is designed such that the edge gas flow 60-1 is able to flow without being blocked or obstructed at the edge. The supply gap 57 has a dimension "G" designed to effectively supply the gas flow to the source vessel. In some embodiments, the gap dimension "G" ranges from about 5 mm to about 15 mm. In some embodiments, the gap dimension "G" is about 10 mm.

The collector module 54 also includes a ring frame 58 integrated with the collector 36 and configured in the center of the collector 36. In some embodiments, the ring frame 58 secures the output window 34. The ring frame 58 is further embedded with gas pipeline 68 for the gas flow 60-2 to the source vessel near the center of the collector 36. The ring frame 58 is made of a suitable solid material, such as stainless steel.

With further reference to FIG. 6 for a portion 66 of the collector module in more details, the gas pipeline 68 is embedded in the ring frame 58 to provide gas paths. The pipeline 68 has an inward entrance (inward opening) 70 and an outward entrance (outward opening) 72. The inward entrance 70 is designed such that the gas flows near the center of the collector and forms the purge cone, therefore protecting the output window 34 from contamination and carries the heat load away by the gas flow. The outward entrance 72 is designed such that the gas flows to the coating surface of the collector 36, and further blows away and carries away the Tin debris, thereby protecting the coating surface from the contamination by the Tin debris. The inward and outward entrances 70 and 72 have a suitable width dimension "W", as illustrated in right side of FIG. 6. In some embodiments, the width dimension "W" ranges from about 3 mm to about 7 mm. In some embodiments, the width dimension "W" is about 5 mm.

All gas paths including the pipeline 68 and the supply gap 57 are coupled with the gas supply module 26 (illustrated in FIG. 1) to provide the gas flows through those gas paths. In some embodiments, the gas supply module 26 provides hydrogen gas and is operable to control the gas flow rate. Hydrogen gas is employed for various considerations. Hydrogen gas has less absorption to the EUV radiation. Hydrogen gas reaching to the coating surface of the collector 36 (and the output window 34 as well) can effectively removes the contaminations from those surfaces. Other suitable gas may be alternatively or additionally used.

With further reference to FIG. 7, thus designed collector module 56 with the gas supply module 26 are able to provide hydrogen gas flows 60 to the source vessel through various gas paths (supply gap 57 and the gas pipeline 68). Particularly, the gas flows 60 include edge gas flow 60-1 through the supply gap 57 and central gas flow 60-2 through the pipeline 60 embedded in the ring frame 58. The central gas flow 60-2 is further split into to an upper gas flow 60-3 through the inward entrance 70 and a side gas flow 60-4 through the outward entrance 72.

Various gas flows combine in the source vessel to form a gas flow pattern including the purge cone near the output window 34 and an air curtain on the coating surface of the collector 36, thereby providing effective protections to the output window 34 and the EUV collector 36, respectively. Especially, the edge gas flow 60-1 passes through the supply gap 57 without obstruction at the solid cover to change its flow direction (as illustrated in FIG. 5). The side gas flow 60-4 is constrained by the outward entrance 72 and is directed toward the coating surface of the collector 36, thus forming an air curtain (hydrogen gas curtain) on the coating surface including its edge portions. As the edge gas flow 60-1 is not directed toward the coating surface, the air curtain is maintained without interruption and covers the whole coating surface of the collector, including its edge portions. The air curtain functions as a protective layer that protects the coating surface from various aspects, which include carrying away the Tin debris with hydrogen flow and further removing the Tin particles from the coating surface if present by the hydrogen gas, such as by mechanical force of the hydrogen gas.

By properly controlled flow rates of the edge gas flow 60-1 and the central gas flow 60-2, the air curtain can be optimized for more protection effectiveness. In some examples, the flow rates of the edge gas flow 60-1 and the central gas flow 60-2 are controlled in a range from about 50 standard liter per minute (SLM) to about 70 SLM.

In addition to the protection of the collector 36 by the air curtain, the purge cone from the upper gas flow 60-4 also effectively protects the output window 34. Thus, without increasing the gas flow rate and the corresponding facility cost, the effective protection mechanism is achieved by implementing the collector module 54.

FIG. 8 is a flowchart of a method 100 for an EUV lithography process implemented by the lithography system 10, constructed in accordance with some embodiments.

The method 100 includes an operation 102 by loading an EUV mask, such as mask 18 to the lithography system 10 that is operable to perform an EUV lithography exposing process. The mask 18 includes an IC pattern to be transferred to a semiconductor substrate, such as the wafer 22. The operation 102 may further include various steps, such as securing the mask 18 on the mask stage 16 and performing an alignment.

The method 100 includes an operation 104 by loading the wafer 22 to the lithography system 10. The wafer 22 is coated with a resist layer. In the present embodiment, the resist layer is sensitive to the EUV radiation from the radiation source 12 of the lithography system 10.

The method 100 includes an operation 106 by providing hydrogen gas to the radiation source 12, thereby generating an air curtain as a protective layer to the coating surface of the collector 36, and further generating a purge cone to protect the output window 34. Particularly, the hydrogen gas flows to the radiation source 12 through various gas paths including the supply gap 57 and the gas pipeline 68. The operation 106 includes controlling the gas flow rates to the supply gap 57 and the gas pipeline 68. In some embodiments, the flow rates (such as 60-1 and 60-2) are individually controlled to respective ranges to optimize the protection effectiveness of the air curtain and purge cone.

The method 100 includes an operation 108 by performing a lithography exposing process to the wafer 24 in the lithography system 10. In the operation 108, the laser 30 and the tin droplet generator 46 are turned on in a synchronized mode (the laser pulse and the tin generation rate are synchronized) through a suitable mechanism, such as a control circuit with timer to control and synchronize the both. In some embodiments, the hydrogen gas flows by the operation 106 remain through the whole duration of the operation 108. During the operation 108, the EUV radiation generated by the radiation source 12 is illuminated on the mask 18 (by the illuminator 14), and is further projected on the resist layer coated on the wafer 24 (by the POB 20), thereby forming a latent image on the resist layer. In some embodiments, the lithography exposing process is implemented in a scan mode.

The method 100 may include other operations to complete the lithography process. For example, the method 100 may include an operation 110 by developing the exposed resist layer to form a resist pattern having a plurality of openings defined thereon. Particularly, after the lithography exposing process at the operation 108, the wafer 24 is transferred out of the lithography system 10 to a developing unit to perform a developing process to the resist layer. The method 100 may further include other operations, such as various baking steps. As one example, the method 100 may include a post-exposure baking (PEB) step between the operations 108 and 110.

The method 100 may further include other operations, such as an operation 112 to perform a fabrication process to the wafer through the openings of the resist pattern. In one example, the fabrication process includes an etch process to the wafer using the resist pattern as an etch mask. In another example, the fabrication process includes an ion implantation process to the wafer using the resist pattern as an implantation mask.

Other alternatives or embodiments may present without departure from the spirit and scope of the present disclosure. In one example, the supply gap 57, the inward entrance 70 and the outward entrance 72 may be designed with different dimensions optimized to form the air curtain and the purge cone. In another example, other type EUV mask, such as a phase shift EUV mask, may be used to further enhance the resolution of the lithography exposing process. In another example, the target material may use other suitable material to generate a high-temperature plasma.

In the LPP EUV radiation source, hot plasma is generated from Tin (Sn) droplets heated by the laser pulse. The hot plasma further produces EUV radiation. The lifetime of the DPP EUV source is limited by various factors. Especially, Sn particles may deposit on the coating surface of the EUV collector mirror, degrading the efficiency of the EUV collector mirror and reducing its lifetime. The disclosed structure of the LPP EUV radiation source and the method utilizing the same effectively address the issues and enhance the lifetime of the collector mirror.

The present disclosure provides an EUV radiation source generated through laser-produced plasma. The EUV radiation source includes a collector integrated with a gas mechanism to provide hydrogen gas flow, thereby forming an air curtain on the coating surface of the collector as a protective layer, and further generating a purge cone to protect the output window. Particularly, the radiation source 12 is designed to include a supply gap at the edge of the collector, and an inward entrance and an outward entrance near the center of the collector. Various hydrogen gas flows through the supply gap, the inward entrance and the outward entrance produce and maintain the air curtain on the EUV collector and the purge cone on the output window during a lithography exposing process. Various operations including controlling the gas flow rates may optimize the protection effectiveness of the air curtain and purge cone. The present disclosure also provides an EUV lithography system with the EUV radiation source and a method using the same.

The embodiments of the present disclosure offer advantages over existing art, though it is understood that other embodiments may offer different advantages, not all advantages are necessarily discussed herein, and that no particular advantage is required for all embodiments. By utilizing the disclosed EUV radiation source, the EUV lithography system and the corresponding method, the contamination to the collector is reduced and the lifetime of the collector is substantially increased. The experiments shown that the existing method could not reduce the contamination effectively. Without the outward entrance, the gas flow could not form a gas layer to cover the whole coating surface of the collector, especially the edge portions of the collector. In that case, the edge portions of the collector have more contamination, and some failure contamination patterns present even within a short use time, such as a few giga (~$10^9$) laser pulses. This limits the lifetime of the collector. By the disclosed structure of the EUV radiation source and the corresponding method, the air curtain covers the whole coating surface of the collector, including its edge portions. The disclosed structure of the collector with moderate flow rate can effectively protect the collector and save the facility cost.

Thus, the present disclosure provides an extreme ultraviolet (EUV) radiation source module in accordance with some embodiments. The EUV radiation source module includes a collector designed to collect and reflect EUV light; a solid cover integrated with the collector and configured to have a supply gap between the collector and the solid cover; and a gas pipeline integrated with the collector. The supply gap provides a path for gas flow to the radiation source at edge of the collector. The gas pipeline includes an inward entrance and an outward entrance.

The present disclosure provides an EUV lithography system in accordance with some embodiments. The EUV lithography system includes a radiation source that further includes a collector designed to collect and reflect EUV light; and a gas flow mechanism integrated with the collector and designed to provide an air curtain as a protective layer to the collector. The gas flow mechanism includes a gas pipeline with an inward entrance and an outward entrance. The EUV lithography system also includes a mask stage configured to secure an EUV mask; a wafer stage configured to secure a semiconductor wafer; and an optical module designed to direct EUV radiation from the radiation source to image an IC pattern defined on the EUV mask to the semiconductor wafer.

The present disclosure provides an EUV lithography process for patterning a target in accordance with some embodiments. The EUV lithography process includes loading an EUV mask to an EUV lithography system that includes a radiation source; a mask stage configured to secure the EUV mask; a wafer stage configured to secure a semiconductor wafer; and an optical module designed to direct the EUV light from the radiation source to image an IC pattern defined on the EUV mask to the semiconductor wafer. The radiation source includes a collector designed to collect and reflect EUV light; and a gas flow mechanism integrated with the collector and designed to provide an air curtain as a protective layer to the collector. The gas flow mechanism includes a gas pipeline with an inward entrance and an outward entrance. The EUV lithography process further includes providing a hydrogen gas to the radiation source through the inward and outward entrances; and exposing the EUV mask by EUV light from the radiation source, while hydrogen gas forms an air curtain on the collector, thereby protecting the collector from contamination.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source module, comprising:
   a collector designed to collect and reflect EUV light generated from plasma;
   a solid cover integrated with the collector and configured to have a supply gap between the collector and the solid cover, wherein the supply gap provides a path for gas flow to the radiation source at edge of the collector; and
   a gas pipeline integrated with the collector, wherein the gas pipeline includes an inward entrance and an outward entrance, wherein the supply gap, the inward entrance and the outward entrance are configured and operable to form an air curtain on the collector, thereby protecting the collector from contamination.

2. The EUV radiation source module of claim 1, further comprising a ring frame integrated with the collector, wherein the gas pipeline is embedded in the ring frame.

3. The EUV radiation source module of claim 2, wherein
   the collector is coated with a reflective layer that reflects the EUV light; and
   the solid cover and ring frame are made of stainless steel.

4. The EUV radiation source module of claim 2, wherein
   the supply gap has a first dimension ranging from about 5 mm to about 15 mm; and
   each of the inward and outward entrances includes a second dimension ranging from about 3 mm to about 7 mm.

5. The EUV radiation source module of claim 2, further comprising a laser-produced plasma (LPP) mechanism that includes:
   a target droplet generator designed to generate target droplets; and
   a laser to generate a laser power, thereby producing the plasma by heating the target droplets with the laser power.

6. The EUV radiation source module of claim 5, further comprising an output window that is transparent to the laser power and configured in the ring frame.

7. The EUV radiation source module of claim 6, wherein the supply gap, the inward entrance and the outward entrance are configured and operable to form a purge cone near the output window, thereby protecting the output window from contamination.

8. An extreme ultraviolet (EUV) lithography system, comprising:
   a radiation source, wherein the radiation source further includes
      a collector designed to collect and reflect EUV light; and
      a gas flow mechanism integrated with the collector and designed to provide an air curtain as a protective layer to the collector, wherein the gas flow mechanism includes a gas pipeline with an inward entrance and an outward entrance, and wherein the gas pipeline surrounds a center of the collector;
   a mask stage configured to secure an EUV mask;
   a wafer stage configured to secure a semiconductor wafer; and
   an optical module designed to direct EUV radiation from the radiation source to image an IC pattern defined on the EUV mask to the semiconductor wafer.

9. The EUV lithography system of claim 8, wherein the radiation source further includes a solid cover integrated with the collector and configured to have a supply gap between the collector and the solid cover, and the supply gap provides a path for gas flow to the radiation source at edge of the collector.

10. The EUV lithography system of claim 9, further comprising a gas supply module to provide a hydrogen gas to the radiation source, wherein the supply gap, the inward entrance and the outward entrance are configured and operable to form an air curtain on the collector, thereby protecting the collector from contamination.

11. The EUV lithography system of claim 8, wherein the radiation source further includes a ring frame integrated with the collector, and the gas pipeline is embedded in the ring frame.

12. The EUV lithography system of claim 11, wherein
    the collector is coated with a reflective layer that reflects the EUV light;
    the solid cover and ring frame are made of stainless steel;
    the supply gap has a first dimension ranging from about 5 mm to about 15 mm, the first dimension spans from the collector to the solid cover; and
    each of the inward and outward entrances includes a second dimension ranging from about 3 mm to about 7 mm.

13. The EUV lithography system of claim 11, wherein the radiation source further includes a laser-produced plasma (LPP) mechanism that includes:
    a target droplet generator designed to generate target droplets; and
    a laser to generate a laser power, thereby producing plasma by heating the target droplets with the laser power.

14. The EUV lithography system of claim 13, wherein the radiation source further includes an output window that is transparent to the laser power and configured in the ring frame.

15. The EUV lithography system of claim 14, wherein the supply gap, the inward entrance and the outward entrance are configured and operable to form a purge cone near the output window, thereby protecting the output window from contamination.

16. An extreme ultraviolet (EUV) lithography process for patterning a target, comprising:
    loading an EUV mask to an EUV lithography system that includes
       a radiation source that includes a collector designed to collect and reflect EUV light; and a gas flow mechanism integrated with the collector and designed to provide an air curtain as a protective layer to the collector, wherein the gas flow mechanism includes a gas pipeline with an inward entrance and an outward entrance, and wherein the gas pipeline is configured around a center of the collector;
    a mask stage configured to secure the EUV mask;

a wafer stage configured to secure a semiconductor wafer; and an optical module designed to direct the EUV light from the radiation source to image an IC pattern defined on the EUV mask to the semiconductor wafer;

providing a hydrogen gas to the radiation source through the inward and outward entrances; and exposing the EUV mask by EUV light from the radiation source, while the hydrogen gas forms an air curtain on the collector, thereby protecting the collector from contamination.

17. The EUV lithography process of claim 16, wherein the radiation source further includes a solid cover integrated with the collector and configured to have a supply gap between the collector and the solid cover; and the providing of the hydrogen gas to the radiation source includes providing the hydrogen gas to the radiation source at edge of the collector through the supply gap.

18. The EUV lithography process of claim 17, wherein the providing of the hydrogen gas to the radiation source includes providing a first gas flow with a first flow rate to the gas pipeline and a second gas flow with a second flow rate to the supply gap.

19. The EUV lithography process of claim 18, wherein the providing of the hydrogen gas to the radiation source includes supplying the hydrogen gas through the supply gap, the inward entrance and the outward entrance, thereby forming an air curtain on the collector, thereby protecting the collector from contamination.

20. The EUV lithography process of claim 19, wherein the providing of the hydrogen gas to the radiation source includes supplying the hydrogen gas through the supply gap, the inward entrance and the outward entrance, thereby forming a purge cone near an output window configured in a ring frame integrated with the collector, thereby protecting the output window from contamination.

* * * * *